United States Patent
Loncke et al.

(10) Patent No.: US 10,778,366 B2
(45) Date of Patent: Sep. 15, 2020

(54) TECHNIQUES FOR RATE MATCHING AND INTERLEAVING IN WIRELESS COMMUNICATIONS

(71) Applicant: QUALCOMM Incorporated, San Diego, CA (US)

(72) Inventors: Vincent Loncke, Piscataway, NJ (US); Raghunath Kalavai, Bedminster, NJ (US); Yi Cao, Parsippany, NJ (US); Thomas Richardson, South Orange, NJ (US); Joseph Binamira Soriaga, San Diego, CA (US); Shrinivas Kudekar, Raritan, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 56 days.

(21) Appl. No.: 15/940,026

(22) Filed: Mar. 29, 2018

(65) Prior Publication Data
US 2018/0294917 A1  Oct. 11, 2018

Related U.S. Application Data

(60) Provisional application No. 62/480,074, filed on Mar. 31, 2017.

(51) Int. Cl.
*H04L 1/00* (2006.01)
*H03M 13/11* (2006.01)

(52) U.S. Cl.
CPC .......... *H04L 1/0013* (2013.01); *H04L 1/0041* (2013.01); *H04L 1/0057* (2013.01);
(Continued)

(58) Field of Classification Search
None
See application file for complete search history.

(56) References Cited

U.S. PATENT DOCUMENTS 6,633,865 B1  10/2003 Liao
6,961,888 B2  11/2005 Jin et al.
(Continued)

FOREIGN PATENT DOCUMENTS

WO  WO-2015/041480 A1  3/2015

OTHER PUBLICATIONS

3GPP TS 36.212: "3 Generation Partnership Project; Technical Specification Group Radio Access Network; Evolved Universal Terrestrial Radio Access (E-UTRA); Multiplexing and channel coding (Release 12)," 3GPP Standard; Technical Specification; 3rd Generation Partnership Project (3GPP), Mobile Competence Centre; 650, Route Des Lucioles; F-06921 Sophia-Antipolis Cedex; France, vol. RAN WG1, No. V12.8.0, Mar. 27, 2016 (Mar. 27, 2016), XP051295160, pp. 1-95, [retrieved on Mar. 27, 2016].
(Continued)

*Primary Examiner* — Lonnie V Sweet
(74) *Attorney, Agent, or Firm* — Arent Fox, LLP

(57) ABSTRACT

Various aspects described herein relate to techniques for rate matching and interleaving in wireless communications (e.g., 5G NR). In an example, a method described herein includes encoding one or more information bits to generate a first codeblock, rate matching the first codeblock to generate a second codeblock, segmenting, using bit distribution, the second codeblock into one or more sub-blocks each having a plurality of bits. The method further includes interleaving the plurality of bits on each of the one or more sub-blocks, concatenating, using bit collection, the one or more sub-blocks to generate a third codeblock in response to the interleaving, and transmitting a signal using the third codeblock.

34 Claims, 13 Drawing Sheets

(52) U.S. Cl.
CPC .......... *H04L 1/0058* (2013.01); *H04L 1/0064* (2013.01); *H04L 1/0067* (2013.01); *H04L 1/0071* (2013.01); *H03M 13/1102* (2013.01)

(56) References Cited

U.S. PATENT DOCUMENTS

| | | | |
|---|---|---|---|
| 7,133,853 B2 | 11/2006 | Richardson et al. | |
| 7,552,097 B2 | 6/2009 | Richardson et al. | |
| 7,627,801 B2 | 12/2009 | Jin et al. | |
| 8,751,902 B2 | 6/2014 | Jin et al. | |
| 2008/0313526 A1* | 12/2008 | Choi ................. | H04L 27/34 714/780 |
| 2011/0131464 A1* | 6/2011 | Ko ..................... | H03M 13/2792 714/752 |
| 2011/0307756 A1* | 12/2011 | Nguyen .............. | H03M 13/036 714/752 |
| 2012/0020435 A1* | 1/2012 | Xu ..................... | H04L 27/3405 375/298 |
| 2016/0149593 A1 | 5/2016 | Shin et al. | |
| 2017/0187489 A1* | 6/2017 | Myung .............. | H03M 13/1102 |

OTHER PUBLICATIONS

International Search Report and Written Opinion—PCT/US2018/025514—ISA/EPO—dated Jun. 28, 2018 19 pages.

Mackay D.J.C., "Good Error-Correcting Codes Based on Very Sparse Matrices," IEEE Transactions on Information Theory, Mar. 1999, vol. 45 (2), pp. 399-431.

Mediatek Inc: "eMBB Encoding Chain," 3GPP Draft; R1-1704458 EMBB_ENCODING_CHAIN_FINAL, 3rd Generation Partnership Project (3GPP), Mobile Competence Centre; 650, Route Des Lucioles; F-06921 Sophia-Antipolis Cedex; France, vol. RAN WG1, No. Spokane, USA; 20170403-20170407, Mar. 25, 2017 (Mar. 25, 2017), XP051251248, 9 pages, Retrieved from the Internet: URL: http://www.3gpp.org/ftp/tsg_ran/WG1_RL1/TSGR1_88b/Docs/ [retrieved on Mar. 25, 2017].

Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.

Samsung: "LDPC Coding Chain for Data Channel," 3GPP Draft; R1-1705418 LDPC_CODING_CHAIN_FOR_DATA_CHANNEL_FINAL, 3rd Generation Partnership Project (3GPP), Mobile Competence Centre; 650, Route Des Lucioles; F-06921 Sophia-Antipolis Cedex; France, vol. RAN WG1, No. Spokane, Washington, USA; 20170403-20170407, Mar. 25, 2017 (Mar. 25, 2017), XP051251920, pp. 1-4, Retrieved from the Internet: URL: http://www.3gpp.org/ftp/tsg_ran/WG1_RL1/TSGR1_88b/Docs/ [retrieved on Mar. 25, 2017].

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.

* cited by examiner

TECHNIQUES FOR RATE MATCHING AND INTERLEAVING IN WIRELESS COMMUNICATIONS

CROSS-REFERENCE TO RELATED APPLICATION

This application claims the benefit of U.S. Provisional Application Ser. No. 62/480,074, entitled "TECHNIQUES FOR LDPC RATE MATCHING AND INTERLEAVING IN WIRELESS COMMUNICATIONS" and filed on Mar. 31, 2017, which is expressly incorporated by reference herein in its entirety.

BACKGROUND

The present disclosure relates generally to wireless communications systems, and more particularly, to techniques and schemes for rate matching and interleaving in wireless communications (e.g., 5G New Radio).

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is Long Term Evolution (LTE) or LTE-Advanced (LTE-A). However, although newer multiple access systems, such as an LTE or LTE-A system, deliver faster data throughput than older technologies, such increased downlink rates have triggered a greater demand for higher-bandwidth content, such as high-resolution graphics and video, for use on or with mobile devices. As such, demand for bandwidth, higher data rates, better transmission quality as well as better spectrum utilization, and lower latency on wireless communications systems continues to increase.

The 5th Generation (5G) New Radio (NR) communications technology, used in a wide range of spectrum, is envisaged to expand and support diverse usage scenarios and applications with respect to current mobile network generations. In an aspect, 5G NR communications technology includes, for example: enhanced mobile broadband (eMBB) addressing human-centric use cases for access to multimedia content, services and data; ultra-reliable low-latency communications (URLLC) with strict requirements, especially in terms of latency and reliability; and massive machine type communications (mMTC) for a very large number of connected devices and typically transmitting a relatively low volume of non-delay-sensitive information. As the demand for mobile broadband access continues to increase, there exists a need for further improvements in 5G communications technology and beyond. Preferably, these improvements should be applicable to other multi-access technologies and the telecommunication standards that employ these technologies.

Accordingly, due to the requirements for increased data rates, higher capacity, and lower latency, new approaches may be desirable to improve the system reliability for data communications by using flexible and enhanced coding/decoding techniques, in order to satisfy consumer demand and improve user experience in wireless communications, e.g., 5G NR communications.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with an aspect, methods, apparatus, and computer-readable medium relate to rate matching and interleaving in wireless communications are provided. According to an example, a method described herein includes encoding one or more information bits to generate a first codeblock, rate matching the first codeblock to generate a second codeblock, segmenting, using bit distribution, the second codeblock into one or more sub-blocks each having a plurality of bits. The method further includes interleaving the plurality of bits on each of the one or more sub-blocks, concatenating, using bit collection, the one or more sub-blocks to generate a third codeblock in response to the interleaving, and transmitting a signal using the third codeblock.

In an aspect, an apparatus for wireless communications is provided that includes a transmitter configured to transmit signals, a memory configured to store instructions, and at least one processor communicatively coupled with the transmitter and the memory. In an example, the at least one processor is configured to execute the instructions to encode one or more information bits to generate a first codeblock, rate match the first codeblock to generate a second codeblock, segment, using bit distribution, the second codeblock into one or more sub-blocks each having a plurality of bits, interleave the plurality of bits on each of the one or more sub-blocks, concatenate, using bit collection, the one or more sub-blocks to generate a third codeblock in response to the interleaving, and transmit, via the transmitter, a signal using the third codeblock.

In another aspect, an apparatus for wireless communications is provided that includes means for encoding one or more information bits to generate a first codeblock, means for rate matching the first codeblock to generate a second codeblock, means for segmenting, using bit distribution, the second codeblock into one or more sub-blocks each having a plurality of bits, means for interleaving the plurality of bits on each of the one or more sub-blocks, means for concatenating, using bit collection, the one or more sub-blocks to generate a third codeblock in response to the interleaving, and means for transmitting a signal using the third codeblock.

In yet another aspect, a computer-readable medium (e.g., a non-transitory computer-readable medium) storing computer code executable by at least one processor for rate matching and interleaving in wireless communications is provided. The computer-readable medium may include code for encoding one or more information bits to generate a first codeblock, code for rate matching the first codeblock to generate a second codeblock, code for segmenting, using bit distribution, the second codeblock into one or more sub-blocks each having a plurality of bits, code for interleaving the plurality of bits on each of the one or more sub-blocks, code for concatenating, using bit collection, the one or more sub-blocks to generate a third codeblock in response to the interleaving, and code for transmitting a signal using the third codeblock.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The accompanying drawings are presented to aid in the description of various aspects of the disclosure and are provided solely for illustration of the aspects and not limitation thereof. The drawings include like reference numbers for like elements, and may represent optional components or actions using dashed lines.

DETAILED DESCRIPTION

Figure 1:
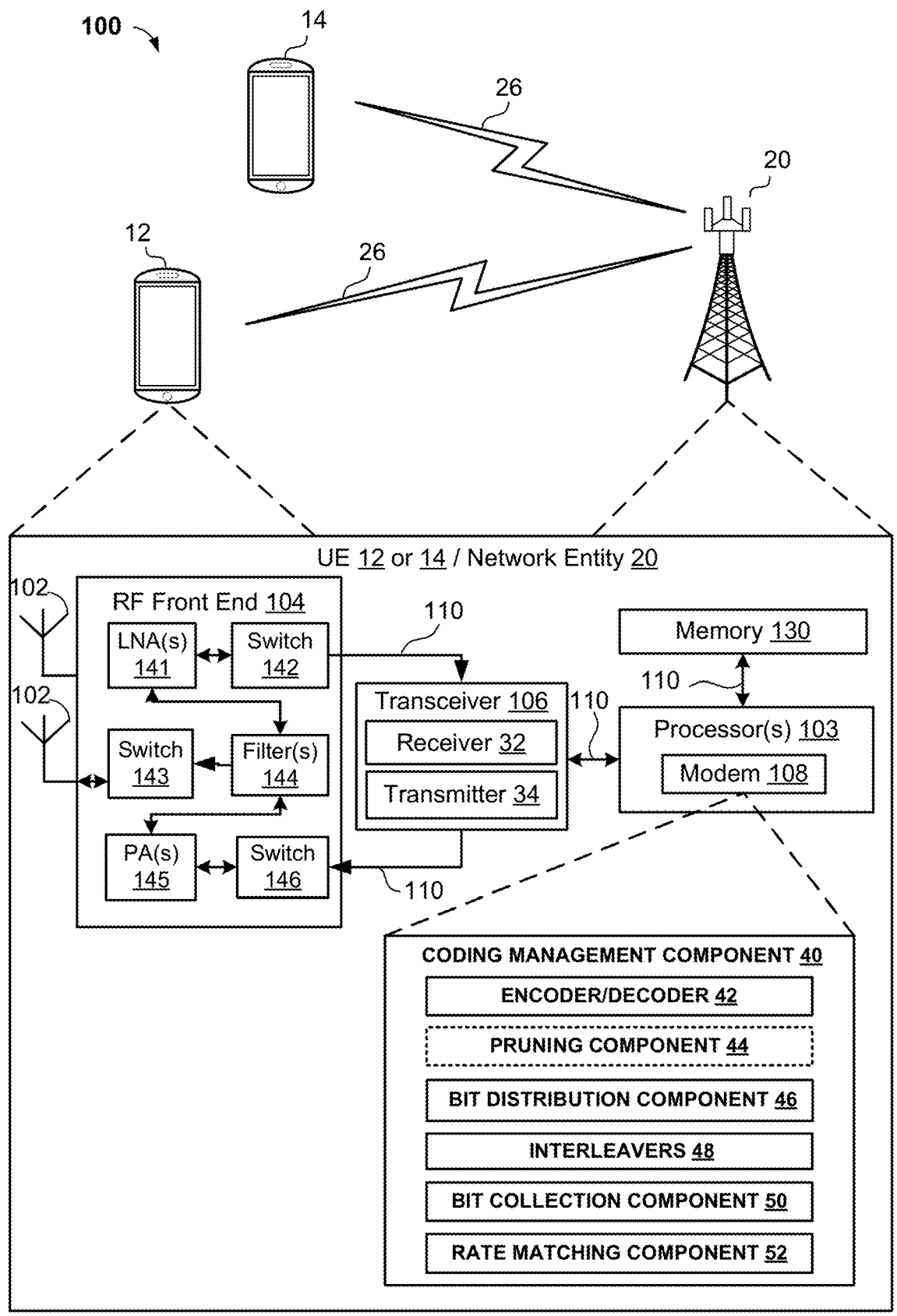
FIG. 1 is a diagram illustrating an example of a wireless communications system (e.g., 5G NR) including an network entity and one or more user equipments (UE) using a rate matching and interleaving scheme, in accordance with various aspects of the present disclosure.

In a conventional wireless communications system, a rate matching stage may be used which involves puncturing or repeating a forward error correction (FEC) codeblock to match the amount of bits allocated on a channel for transmission of the FEC codeblock. In an example, the size of the FEC codeblock may differ from a native codeblock size produced by an FEC encoder. In addition to the puncturing and repeating step there may be one or more interleavers to help mitigate burst errors in the channel caused by fading, and/or to randomize over unequally protected bits drawn from the demodulation(s) of modulated symbols (e.g., quadrature amplitude modulation (QAM) constellation symbols).

In 5G NR, as the demand for increased data rates, higher throughput, and lower latency, some existing coding/decoding schemes may not be able to meet the requirements. For example, in an aspect, low density parity check (LDPC) may be used for data channels, and flexible coding/decoding designs are desired to support low latency and high throughputs. In another aspect, LDPC codes may be extended from a high rate to get a lower rate code, which may be useful for supporting incremental redundancy (IR) hybrid automatic repeat request (HARM) transmissions and receptions. In some aspects, new approaches using rate matching and interleaving schemes with LDPC may be desirable to improve the system reliability for data transmissions and receptions.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

The present disclosure relates to a LDPC rate matching and interleaving scheme for LDPC encoded payloads in a communications system. In an example, the scheme may include a LDPC rate matching chain with one or more intra codeblocks and/or one or more tone interleavers. In some aspects, the LDPC rate matching and interleaving scheme may include a codeword generation step followed by an intra codeword interleaver which may be a row/column interleaver in units of Z bits or a cyclic rotation of codeword bits in slices of Z bits. In an aspect, following the interleaver there may be a circular buffer step that is used to repeat the codeblock and then a tone interleaver which operates on an orthogonal frequency division multiplexing (OFDM) symbol.

Referring to FIG. 1, in an aspect, a wireless communications system 100 (e.g., a 5G NR system) includes at least one UE 12 or UE 14 in communication coverage of at least one network entity 20 (e.g., a base station or an eNB, or a cell thereof, in an LTE network or a 5G NR network). UE 12 and/or UE 14 may communicate with a network via the network entity 20. In some aspects, multiple UEs including UE 12 and/or UE 14 may be in communication coverage with one or more network entities, including network entity 20. In an aspect, the network entity 20 may be a base station such an eNodeB/eNB in 5G or New Radio (NR) technology network, and/or in an LTE network. Although various aspects are described in relation to the Universal Mobile Telecommunications System (UMTS), LTE, or 5G NR networks, similar principles may be applied in other wireless wide area networks (WWAN). The wireless network may employ a scheme where multiple base stations may transmit on a channel. In an example, UE 12 and/or UE 14 may transmit and/or receive wireless communications to and/or from network entity 20. For example, the UE 12 and/or UE 14 may be actively communicating with network entity 20.

In some aspects, UE 12 and/or UE 14 may also be referred to by those skilled in the art (as well as interchangeably herein) as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. A UE 12 and/or UE 14 may be a cellular phone, a personal digital assistant (PDA), a wireless modem, a wireless communication device, a handheld device, a tablet computer, a laptop computer, a cordless phone, a wireless local loop (WLL) station, a global positioning system (GPS) device, a multimedia device, a video device, a digital audio player (e.g., MP3 player), a camera, a game console, a wearable computing device (e.g., a smart-watch, smart-glasses, a health or fitness tracker, etc.), an appliance, a sensor, a vehicle communication system, a medical device, a vending machine, a device for the Internet-of-Things, or any other similar functioning device. Additionally, network entity 20 may be a macrocell, picocell, femtocell, relay, Node B, mobile Node B, small cell box, UE (e.g., communicating in peer-to-peer or ad-hoc mode with UE 12 and/or UE 14), or substantially any type of component that can communicate with UE 12 and/or UE 14 to provide wireless network access at the UE 12 and/or UE 14.

According to the present aspects, the UE 12 and/or UE 14 may include one or more processors 103 and a memory 130 that may operate in combination with a coding management component 40 to control an LDPC encoder/decoder 42, a pruning component 44, a bit distribution component 46, one or more interleavers 48, a bit collection component 50, and/or a rate matching component 52 for performing rate matching and/or interleaving as described herein. Similarly, the network entity 20 may include one or more processors 103 and a memory 130 that may operate in combination with a coding management component 40 to control an LDPC encoder/decoder 42, a pruning component 44, a bit distribution component 46, one or more interleavers 48, a bit collection component 50, and/or a rate matching component 52 for performing rate matching and/or interleaving as described herein.

For example, the coding management component 40 may perform a rate matching and interleaving scheme with LDPC codes. In an aspect, the term "component" as used herein may be one of the parts that make up a system, may be hardware, firmware, and/or software, and may be divided into other components. The coding management component 40 may be communicatively coupled with a transceiver 106, which may include a receiver 32 for receiving and processing RF signals and a transmitter 34 for processing and transmitting RF signals. The coding management component 40 may include the LDPC encoder/decoder 42, the pruning component 44, the bit distribution component 46, the one or more interleavers 48, the bit collection component 50, and/or the rate matching component 52 for performing rate matching and/or interleaving management and operations. The processor 103 may be coupled with the transceiver 106 and memory 130 via at least one bus 110.

The receiver 32 may include hardware, firmware, and/or software code executable by a processor for receiving data, the code comprising instructions and being stored in a memory (e.g., computer-readable medium). The receiver 32 may be, for example, a radio frequency (RF) receiver. In an aspect, the receiver 32 may receive signals transmitted by UE 12 and/or UE 14 or network entity 20. The receiver 32 may obtain measurements of the signals. For example, the receiver 32 may determine Ec/Io, SNR, etc.

The transmitter 34 may include hardware, firmware, and/or software code executable by a processor for transmitting data, the code comprising instructions and being stored in a memory (e.g., computer-readable medium). The transmitter 34 may be, for example, an RF transmitter.

In an aspect, the one or more processors 103 can include a modem 108 that uses one or more modem processors. The various functions related to the coding management component 40 may be included in modem 108 and/or processors 103 and, in an aspect, can be executed by a single processor, while in other aspects, different ones of the functions may be executed by a combination of two or more different processors. For example, in an aspect, the one or more processors 103 may include any one or any combination of a modem processor, or a baseband processor, or a digital signal processor, or a transmit processor, or a transceiver processor associated with transceiver 106. In particular, the one or more processors 103 may implement components included in the coding management component 40, including the LDPC encoder/decoder 42, the pruning component 44, the bit distribution component 46, the one or more interleavers 48, the bit collection component 50, and/or the rate matching component 52.

The coding management component 40, the LDPC encoder/decoder 42, the pruning component 44, the bit distribution component 46, the one or more interleavers 48, the bit collection component 50, and/or the rate matching component 52 may include hardware, firmware, and/or software code executable by a processor for performing coding, rate matching and interleaving management and operations. For example, the hardware may include, for example, a hardware accelerator, or specialized processor.

Moreover, in an aspect, UE 12 and/or UE 14 and/or network entity 20 may include RF front end 104 and transceiver 106 for receiving and transmitting radio transmissions, for example, wireless communications 26. For example, transceiver 106 may transmit or receive a signal that encoded by an LDPC PCM. The transceiver 106 may monitor and/or decode the received signal based on the LDPC PCM. For example, transceiver 106 may communicate with modem 108 to transmit messages generated by coding management component 40 and to receive messages and forward them to coding management component 40.

RF front end 104 may be connected to one or more antennas 102 and can include one or more low-noise amplifiers (LNAs) 141, one or more switches 142, 143, one or more power amplifiers (PAs) 145, and one or more filters 144 for transmitting and receiving RF signals. In an aspect, components of RF front end 104 can connect with transceiver 106. Transceiver 106 may connect to one or more modems 108 and processor 103.

In an aspect, LNA 141 can amplify a received signal at a desired output level. In an aspect, each LNA 141 may have a specified minimum and maximum gain values. In an aspect, RF front end 104 may use one or more switches 142, 143 to select a particular LNA 141 and its specified gain value based on a desired gain value for a particular application. In an aspect, the RF front end 104 may provide measurements (e.g., Ec/Io) and/or applied gain values to the coding management component 40.

Further, for example, one or more PA(s) 145 may be used by RF front end 104 to amplify a signal for an RF output at a desired output power level. In an aspect, each PA 145 may have a specified minimum and maximum gain values. In an aspect, RF front end 104 may use one or more switches 143, 146 to select a particular PA 145 and its specified gain value based on a desired gain value for a particular application.

Also, for example, one or more filters 144 can be used by RF front end 104 to filter a received signal to obtain an input RF signal. Similarly, in an aspect, for example, a respective filter 144 can be used to filter an output from a respective PA 145 to produce an output signal for transmission. In an aspect, each filter 144 can be connected to a specific LNA 141 and/or PA 145. In an aspect, RF front end 104 can use one or more switches 142, 143, 146 to select a transmit or receive path using a specified filter 144, LNA, 141, and/or PA 145, based on a configuration as specified by transceiver 106 and/or processor 103.

Transceiver 106 may be configured to transmit and receive wireless signals through antenna 102 via RF front end 104. In an aspect, transceiver may be tuned to operate at specified frequencies such that UE 12 and/or UE 14 can communicate with, for example, network entity 20. In an aspect, for example, modem 108 can configure transceiver 106 to operate at a specified frequency and power level based on the UE configuration of the UE 12 and/or UE 14 and communication protocol used by modem 108.

In an aspect, modem 108 can be a multiband-multimode modem, which can process digital data and communicate with transceiver 106 such that the digital data is sent and received using transceiver 106. In an aspect, modem 108 can be multiband and be configured to support multiple frequency bands for a specific communications protocol. In an aspect, modem 108 can be multimode and be configured to support multiple operating networks and communications protocols. In an aspect, modem 108 can control one or more components of UE 12 and/or UE 14 or network entity 20 (e.g., RF front end 104, transceiver 106) to enable transmission and/or reception of signals based on a specified modem configuration. In an aspect, the modem configuration can be based on the mode of the modem and the frequency band in use. In another aspect, the modem configuration can be based on UE configuration information associated with UE 12 and/or UE 14 as provided by the network during cell selection and/or cell reselection.

UE 12 and/or UE 14, or network entity 20 may further include memory 130, such as for storing data used herein and/or local versions of applications or coding management component 40 and/or one or more of its subcomponents being executed by processor 103. Memory 130 can include any type of computer-readable medium usable by a computer or processor 103, such as random access memory (RAM), read only memory (ROM), tapes, magnetic discs, optical discs, volatile memory, non-volatile memory, and any combination thereof. In an aspect, for example, memory 130 may be a computer-readable storage medium that stores one or more computer-executable codes defining coding management component 40 and/or one or more of its subcomponents, and/or data associated therewith, when UE 12 and/or UE 14 and/or network entity 20 is operating processor 103 to execute coding management component 40 and/or one or more of its sub-components. In another aspect, for example, memory 130 may be a non-transitory computer-readable storage medium.

Figure 2:
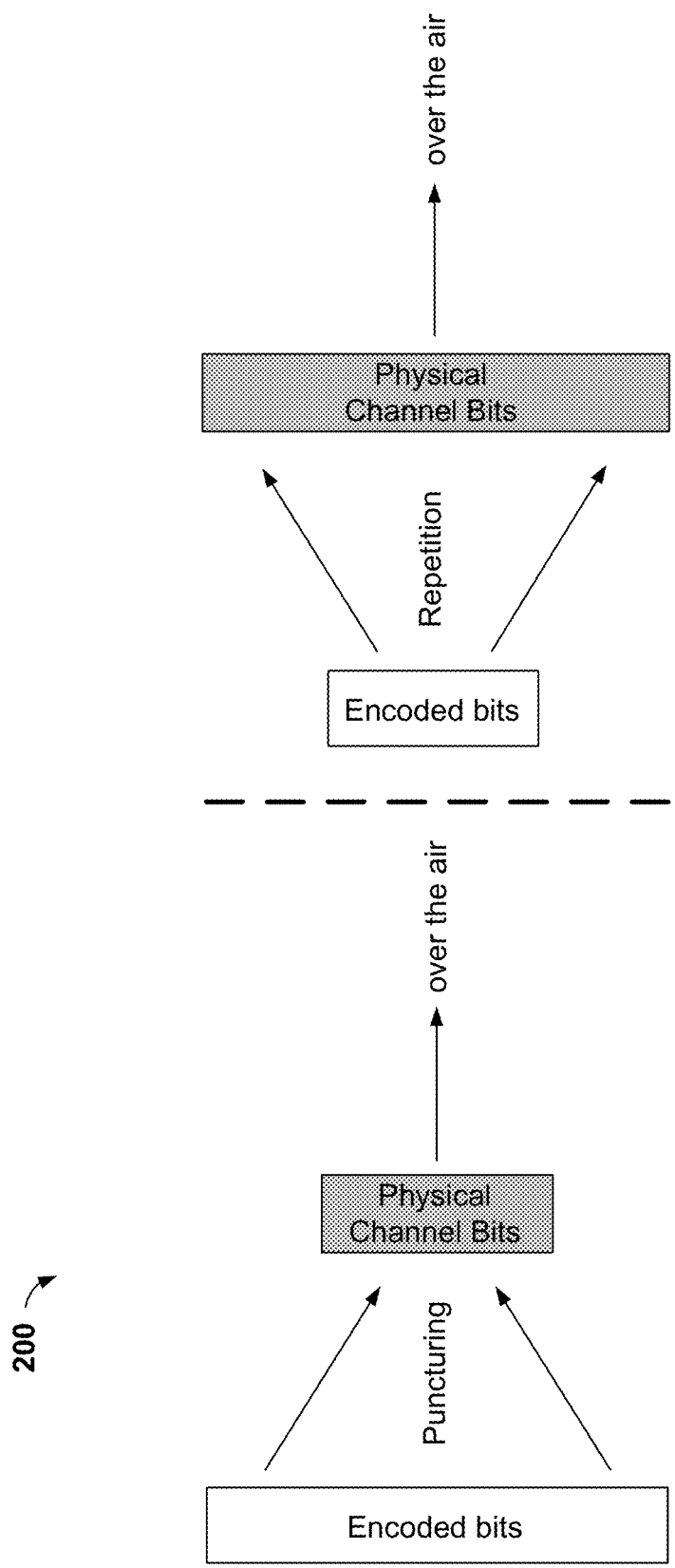
FIG. 2 is an example of a rate matching scheme including puncturing or repetition of encoded bits, in accordance with various aspects of the present disclosure.

In a wireless communications system (e.g., an LTE system or a 5G NR system), an information stream to be transmitted may be segmented into groups of bits for which each group of bits gets encoded by a channel code, such as LDPC or Turbo codes, into a codeblock. In some order, the codeblocks undergo a permutation and/or a truncation or extension operation. The permutation is to distribute distortions due to the communications channel across the codeblocks. For instance, periodicities due to QAM constellation mapping or frequency selective channel distortions require an interleaver to randomize the distortion across the codeblocks. The truncation or extension step is to dimension the payload(s) to match the size of the resources allocated to transmit the encoded payload(s). In some examples, the truncating or extension operation may be considered as rate matching with a puncturing or repetition step as illustrated in FIG. 2.

In some examples, payloads may be provided by media access control (MAC) layer, and may break into segments with bits, may be encoded into codeblocks, and punctuated or repeated to be able to fit in the allocation provided by resources scheduling or grants.

Figure 3:
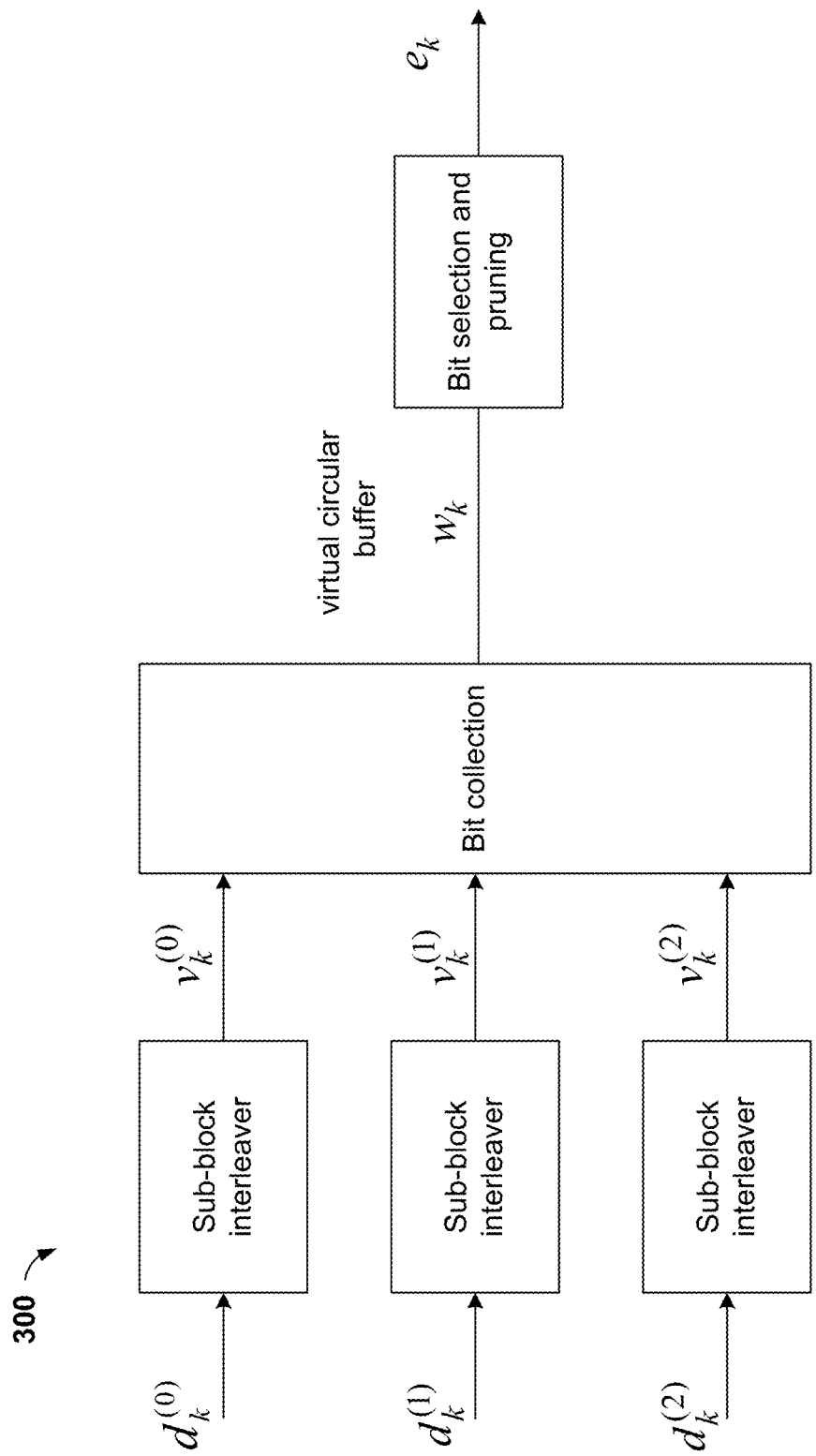
FIG. 3 illustrates an example of rate matching and interleaving steps in a conventional communications system (e.g., an LTE system), in accordance with various aspects of the present disclosure.

In an aspect, FIG. 3 illustrates an example of rate matching and interleaving steps in a conventional communications system (e.g., an LTE system). In some examples, the rate matching and/or interleaving steps may need to consider channel bandwidth, random or pseudo-random distortions to payload(s), and/or periodic distortions (e.g., due to QAM modulation). In an aspect, for example, after an encoder (e.g., a Turbo encoder), a rate matching and interleaver chain 300 may include three input, $d_k^{(0)}$ is an information payload (systematic bits, e.g., as shown in green portions of the circular buffer in FIG. 6), and $d_k^{(1)}$ and $d_k^{(2)}$ are redundancy information (parity bits, e.g., as shown in purple and blue portions of the circular buffer in FIG. 6). After three sub-block interleavers, a bit collection is performed independently. Then, a virtual circular buffer and a bit selection and pruning may be used, where the bit selection and pruning step may perform the rate matching as shown in FIG. 2.

Figure 4:
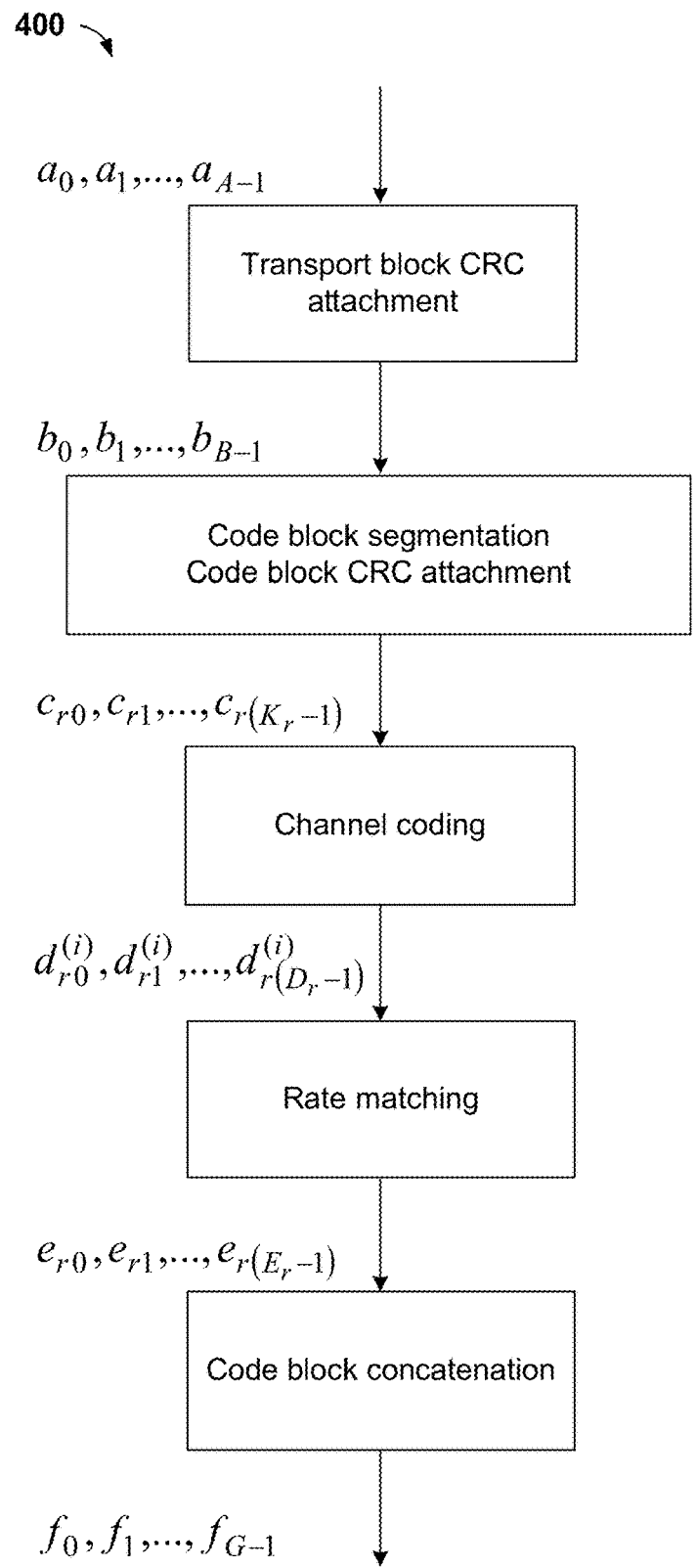
FIG. 4 illustrates an example of an encoding chain for downlink transmissions in a conventional communications system (e.g., an LTE system), in accordance with various aspects of the present disclosure.
Figure 5:
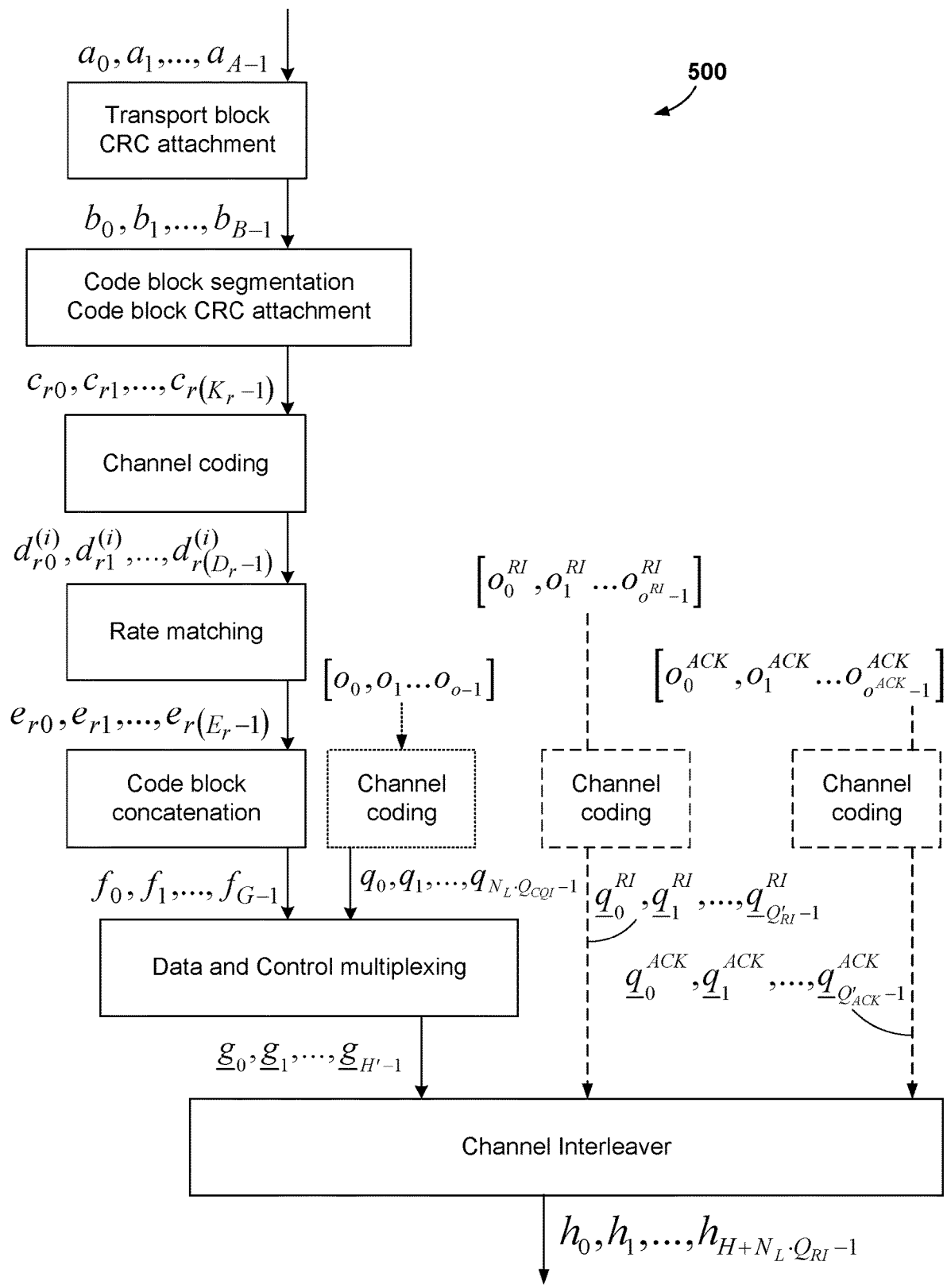
FIG. 5 illustrates an example of an encoding chain for uplink transmissions in a conventional communications system (e.g., an LTE system), in accordance with various aspects of the present disclosure.

In an aspect, FIG. 4 illustrates an example of an encoding chain 400 for downlink transmissions in a conventional communications system (e.g., an LTE system). In some examples, the rate matching step in FIG. 4 may correspond to the rate matching and interleaver chain 300 in FIG. 3. In an aspect, FIG. 5 illustrates an example of an encoding chain 500 for uplink transmissions in a conventional communications system (e.g., an LTE system).

In some examples, rate matching and interleaving steps in a conventional communications system (e.g., an LTE system) may be described as follows. First, an encoding chain (e.g., the encoding chain 400 or 500) may attach transport block CRC followed by codeblock segmentation and turbo encoding, then the encoding chain 500 may perform Turbo encoding produces rate 1/3 mother codeblock(s). In an example, Rate 1/3 mother codeblock(s) is partitioned into 3 sections: systematic, parity 0, and parity 1. In an aspect, each codeblock section may be fed to a sub-block interleaver which applies a row/column interleaver on a bit stream. The output of the sub-block interleavers may feed a bit collection step which interweaves the parity 0 and parity 1 sub-block interleaved bits. The output of the bit collection step may feed a circular buffer. The bits to be transmitted are read from the circular buffer at a starting index labeled the 'rv' index. The bits are read from the circular buffer to fill up the allocated channel bits for transmission of the codeblock. In an aspect, codeblock puncturing may occur when the allocated channel bits are less than the length of the mother codeblock length. For this the circular buffer is partially traversed without wraparound. In another aspect, codeblock repetition may occur when the allocated channel bits are greater than the length of the mother codeblock length. In this scenario the circular buffer read wraps around, repeating the codeblock bits into the channel allocation. The circular buffer is illustrated in FIG. 6.

Figure 6:
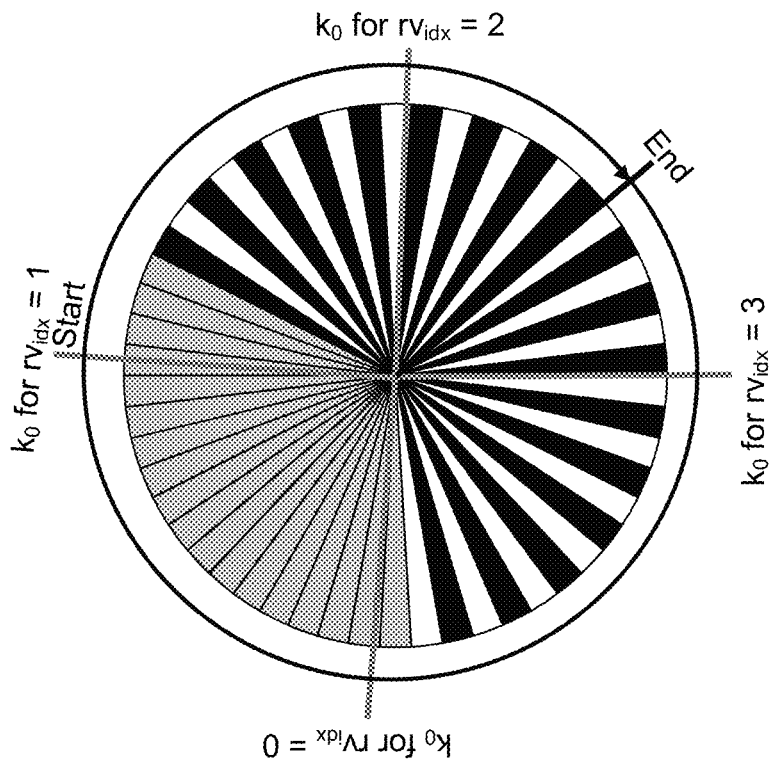
FIG. 6 illustrates an example of a rate matching circular buffer with puncturing or repetition of encoded bits, in accordance with various aspects of the present disclosure.
Figure 6:
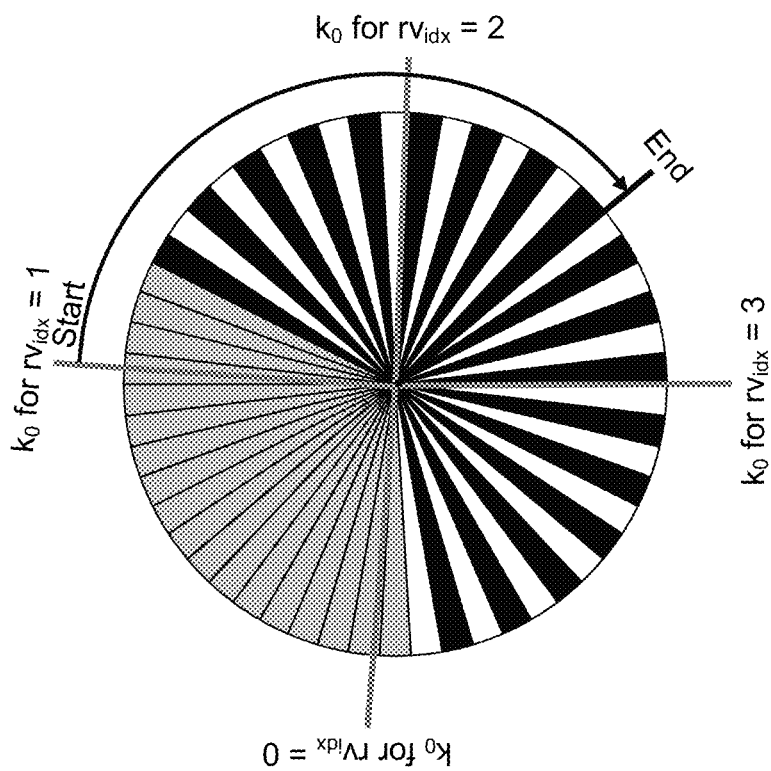

Referring to FIG. 6, in some examples, different colors (purple and blue) are used to represent different parity sessions of the parity portion. In an aspect, the encoded data may be input to a circular buffer 600, punctured by each bit, and/or search a RV index. In an example, the amount of distance that go around the circle may correspond to a portion of or the same amount of bits allocated for the channel for transmission. When pulling the bits from the circular buffer 600, if the bits being pulled are less than the bits in a code block, less degree is used (e.g., 160 degree). If the pulled bits are more than the bits from a code block (e.g., by repetition), more degrees are used (e.g., more than 360 degree), and may be wrapped around more than once. On the receiver side, the decoding process may combine different portions and average all the bits, which may lead to better performance, because the receiver also averaging the received noise. In a conventional communications system (e.g., an LTE system), in an aspect, an entire mother code may be used. When interleaving a bit collection, the system may pick a portion of the bit collection, or repeat at least a portion of the bit collection. In an example, the system may puncture or repeat at least a portion of the bit collection at the end of a rate matching and interleaving chain (e.g., the rate matching and interleaver chain 300 in FIG. 3). In some examples, a Turbo encoder or decoder may operate on one or more punctured mother codes.

In some aspects, an error correcting coding technology, LDPC, may be used in some applications such as wireless communications, storage, and/or Ethernet. LDPC is based on designing codes on bipartite graphs. In an aspect, LDPC decoding may be implemented using belief propagation techniques where messages are passed along edges of the graph and the nodes in the graph compute their marginal distributions from which decisions on the source symbols may be made. In some examples, Quasi-Cyclic (QC) codes, a popular class of structured LDPC codes, may be used where a base LDPC Parity Check Matrix (PCM) gets "lifted". The lifting of QC codes entails replacing each base PCM entry with an M-by-M (M×M) sub-matrix. In some examples, the M×M sub-matrix may be a matrix of all zeros for '0' base PCM entries or a cyclically rotated identity matrix for '1' base PCM entries. In some examples, QC LDPC codes may enable parallel processing in hardware by enabling decoders to replicate processing M times with switching networks to exchange messages.

In some examples, when using LDPC encoding/decoding (e.g., in a 5G NR system), the rate matching and interleaving steps may be reordered or reorganized because of the nature of the LDPC codes. For example, when using an LDPC PCM, the system may built a code structure, encode payload, perform a matrix operation (e.g., multiplying the payload by the matrix), where each row in the matrix (e.g., PCM) constitutes an individual parity check on a collection of bits within a codeword. In some examples, after a base matrix (e.g., LDPC PCM) has been built and the size of the matrix has been configured, each location of the matrix may get lifted by a sub-matrix (e.g., the M×M sub-matrix), where the sub-matrix constitutes an identity matrix that gets some cyclic rotation assigned to the identity matrix.

In an example, a binary PCM (e.g., LDPC PCM) is shown in Table 1. Each column corresponds to a bit in the codeword, and each row corresponds to a parity check. In Table 1, the first row is a column index and represents the column numbers, the second row indicates whether the bit is a systematic bit ("1") or a parity bit ("0"), and the third row indicates whether the bit is punctured (e.g., always punctured="0"). In an aspect, the binary PCM specification may define constraints on coded sequence, and may be used to derive encoder for parity bits from systematic bits. Specified by a base graph, the PCM may consist of shifted identity sub-block(s). In an aspect, QC LDPC may have easy encoding and decoding description, for example, LDPC codes may be considered as codes over a ring of binary vectors. In some example, by replacing each column in the PCM with random permutation on lift (e.g., same value needed in each row for the column (e.g., weight=2)), values randomly chosen by or with columns, which may apply only to parity and/or parity extension block(s), and reflect in the PCM specification.

700 may have a long degree 1 chain as illustrated. The degree 1 chain allows for fine grained rate adjustment where each degree 1 column constitutes an additional parity check row which in turn adjusts the coding rate lower. The structure may be used for an HARQ process where the coding rate may be incrementally lowered, upon retransmission of codeblocks that failed to decode in prior transmissions. As a result, puncturing of the LDPC code (e.g., in a 5G NR system) may be done during the encoding operation as opposed to being done on the mother code based through the circular buffer, e.g., in a Turbo encoded LTE system. In some examples, a conventional communications system

TABLE 1

An example of parity check matrix (PCM)

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|----|----|----|----|----|----|----|----|----|----|----|----|----|----|----|
| 1 | 1 | 1 | 1 | 1 | 1 | 1 | 1 | 1 | 1  | 0  | 0  | 0  | 0  | 0  | 0  | 0  | 0  | 0  | 0  | 0  | 0  | 0  | 0  |
| 0 | 0 | 1 | 1 | 1 | 1 | 1 | 1 | 1 | 1  | 1  | 1  | 1  | 1  | 1  | 1  | 1  | 1  | 1  | 1  | 1  | 1  | 1  | 1  |
| 11 | . | 2 | . | . | . | 9 | . | . | .  | .  | 1  | 0  | .  | .  | .  | .  | .  | .  | .  | .  | .  | .  | .  |
| . | 11 | . | . | . | 9 | . | 1 | . | .  | .  | .  | 0  | 0  | .  | .  | .  | .  | .  | .  | .  | .  | .  | .  |
| 3 | . | . | 2 | 12 | . | . | . | . | 6  | .  | .  | .  | 0  | 0  | .  | .  | .  | .  | .  | .  | .  | .  | .  |
| . | 0 | . | . | . | 6 | 2 | . | 3 | .  | .  | .  | .  | .  | 0  | 0  | .  | .  | .  | .  | .  | .  | .  | .  |
| 14 | 15 | . | . | . | . | 3 | 9 | . | 2  | .  | .  | .  | .  | .  | 0  | 0  | .  | .  | .  | .  | .  | .  | .  |
| 2 | 6 | 7 | . | 10 | . | . | . | . | .  | .  | .  | .  | .  | .  | .  | 0  | 0  | .  | .  | .  | .  | .  | .  |
| 4 | 11 | . | 15 | . | 15 | . | . | . | .  | .  | 0  | .  | .  | .  | .  | .  | 0  | 0  | .  | .  | .  | .  | .  |
| 12 | 11 | 13 | . | . | . | . | 13 | 9 | .  | .  | .  | .  | .  | .  | .  | .  | .  | 0  | 0  | .  | .  | .  | .  |
| 3 | 1 | . | 4 | . | . | . | 15 | . | .  | .  | .  | .  | .  | .  | .  | .  | .  | .  | 0  | 0  | .  | .  | .  |
| 10 | 5 | . | . | 7 | . | . | 2 | . | .  | 1  | .  | .  | .  | .  | .  | .  | .  | .  | .  | .  | 0  | .  | .  |
| 12 | 15 | . | . | . | . | . | . | . | .  | 0  | .  | .  | .  | .  | .  | .  | .  | .  | .  | .  | .  | 0  | .  |
| 9 | 9 | . | . | . | . | . | . | 6 | .  | 0  | .  | .  | .  | .  | .  | .  | .  | .  | .  | .  | 0  | .  | .  |
| . | 13 | . | . | . | . | . | . | 6 | 15 | 8  | .  | .  | .  | .  | .  | .  | .  | .  | .  | .  | .  | 0  | .  |
| 12 | 8 | . | . | . | . | . | . | . | .  | 9  | .  | .  | .  | .  | .  | .  | .  | .  | 11 | .  | .  | .  | 0  |

Figure 7:
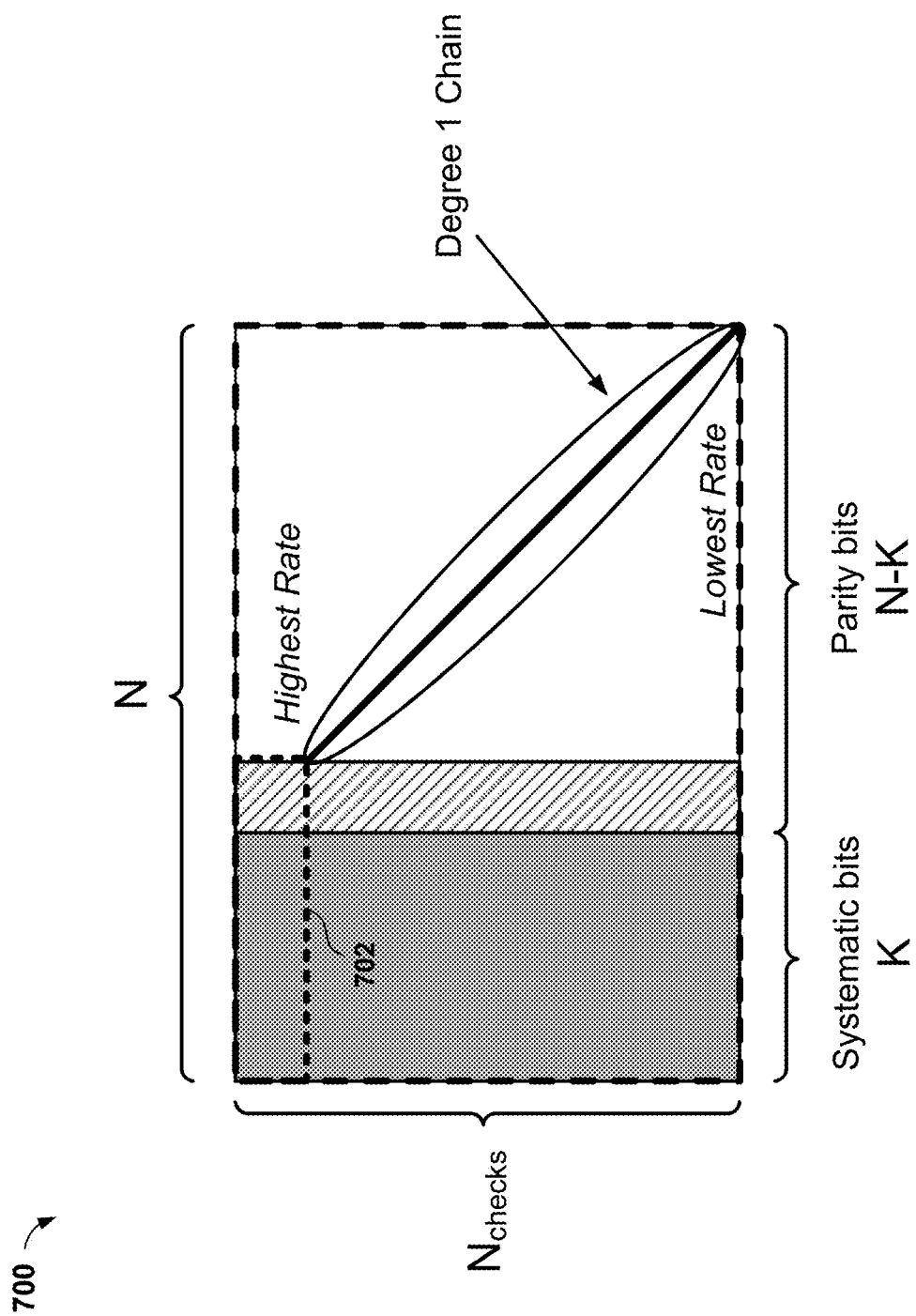
FIG. 7 illustrates an example of a rate compatible low density parity check (LDPC) parity check matrix (PCM) for a codeblock, in accordance with various aspects of the present disclosure.

In some aspects of the present disclosure, a 5G NR system may use LDPC as the coding technology for an eMBB use case. For example, a rate compatible LDPC structure may be adopted to allow for finer granularity on codeblock lengths and coding rates. An example structure 700 of the rate compatible LDPC PCM is illustrated in FIG. 7. In an aspect, a user equipment or a base station may generate a codeword for transmission, and perform payload encoding (e.g., using systematic bits) and include a redundancy portion (e.g., using parity bits, and/or for repeatable errors). In an example, one entire codeword (e.g., wrap around in FIG. 6) may correspond to one revolution around a 360 degree circle. The codeword may start at some point at the circular buffer, wrapping around, and puncturing the codeword (e.g., company more channel bits, and may be more than one 360 degree circle).

Still referring to FIG. 7, in an example, the rate compatible LDPC PCM may start with a high coding rate (e.g., in block 702), and then configure and/or send additional parity bits (e.g., via IR). The long degree 1 chain may include a set of codes or additional parity bits, which triggers additional parity check at a lower coding rate. In some cases, the LDPC encoder and/or the rate matching step may perform or include random permutation on parity-extension.

In an aspect, for an LDPC code construction (e.g., in a 5G NR system), bits out of the encoder may be shortened or punctured to produce a desired codeblock length. In some cases, if the shortened or punctured bits are not transmitted, interleaving of the shortened or punctured bits may be disabled or not configured.

Referring to FIG. 7, in an example, the LDPC PCM structure 700 (e.g., in a 5G NR system) may contain totally N bits, which include K systematic bits and N−K parity bits, and N times of checks. In addition, the LDPC PCM structure (e.g., an LTE system) may include a Turbo encoder that provides a mother code that gets punctured externally (e.g., outside of the encoder). In a 5G NR system, for example, puncturing may be part of an encoding step, which may be performed with or within an LDPC encoder. In some cases, an LDPC encoder/decoder may operate on a nested code, for instance, rate 1/3 mother code may be punctured to rate 1/2.

In some aspect, LDPC and FEC may be used for data transmissions in a 5G NR system. In an example, rate matching may be used to adjust the length and rate of encoded payload(s) to match the sub-channel bit allocated for data transmissions.

In some aspects related to interleaving, to mitigate burst or periodic distortions, an interleaver may be introduced to randomize the distortion across transmitted payload(s). In wireless channels, two types of distortions may be of concern (e.g., in addition to others). For example, the first type is a frequency selective distortion cause by multipath where the wireless signal is received from multiple reflected paths, and the second type is a periodic distortion caused by unequal protection of bits within a QAM modulated signal. In some examples, intra codeblock interleaving may be used to generate randomization.

In some examples, an LDPC codeblock may not occupy the entire bandwidth, a tone level interleaver that interleaves tones across the entire transmission bandwidth may be used to mitigate frequency selective distortions. For example, the interleaver may operate on groups of codeblocks spread across the bandwidth of operation. To help mitigate the frequency selective distortion and to mitigate the periodic distortions, an intra-codeblock bit interleaver may be leveraged as well. In some examples, the LDPC PCM structure may imitate a random connectivity between codeblock bits and the parity check rows, there may be an inherent resilience to burst or periodic distortions. In an aspect, some distortion periodicities may create pathologies that lead to reduced performance. Given the LDPC inherent resilience to such distortions, an interleaver within groupings of Z sub-codeblock bits may be used with Z encompassing up to the entire codeblock size or a subset of the entire codeblock size (e.g., one or more codeblock bits). In an example, by limiting the interleaver to a subset of the entire codeblock (e.g., Z bits), hardware complexity and latency may be reduced. In some cases, allowing a larger Z (e.g., with more bits) may facilitate better bit error rate (BER) performance (e.g., with lower BER) compared with using a smaller Z. In some cases, Z may be the dimension of a QC matrix having QC codes.

Figure 8A:
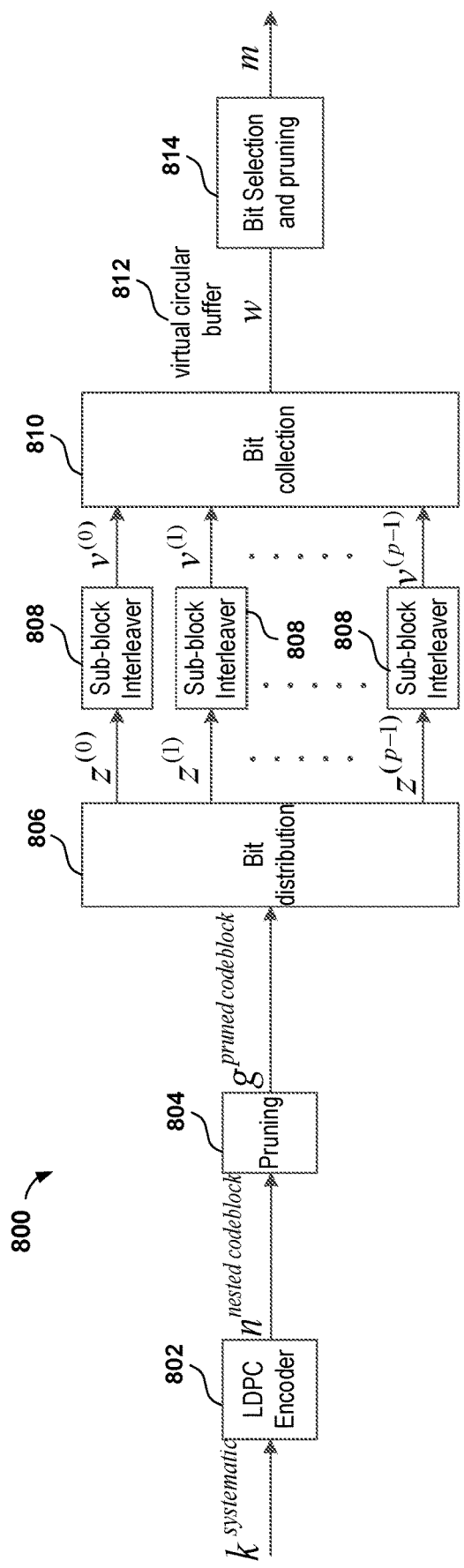
FIG. 8A illustrates a first example of a rate matching and interleaving scheme, in accordance with various aspects of the present disclosure.

Referring to FIG. 8A, in an aspect, a rate matching and interleaver chain 800 (or rate matching plus interleaver chain) is illustrated. In some aspects, the rate matching and interleaver chain 800 may include one or more of steps. In some examples, an LDPC encoder 802 which takes in information bit payload and LDPC encodes leveraging a rate-compatible LDPC code with a structure same or similar to FIG. 7. In an aspect, the nested codeblock produced by the LDPC encoder 802 may be sized to a block length and rate consistent with the scheduled resources and rate allocated for transmission. In an example, an pruning 804 (e.g., an optional step) follows the LDPC encoder 802 for removal of one or more filler bits, and to perform any necessary residual pruning such as puncturing bits or puncturing from the tail or the head of the LDPC codeblock. In an example, the pruning 804 may be merged with the LDPC encoder 802.

In an aspect, a bit distribution 806 may segment the pruned codeblock of g bits into $$p = \lceil \tfrac{g}{z} \rceil$$

sections of Z bits each, where the last section may be zero padded if g is not an even multiple of Z. In some examples, a respective sub-block interleaver 808 may be used or configured on each of the p sections (having Z bits for each section). In an aspect, a bit collection 810 to concatenate the Z bit sections and feed a virtual circular buffer. In some cases, a bit selection and pruning 814 may configured to perform repetition and/or pruning. In some other cases, after modulation, a tone interleaver may be implemented that interleaves tones within a symbol.

Figure 8B:
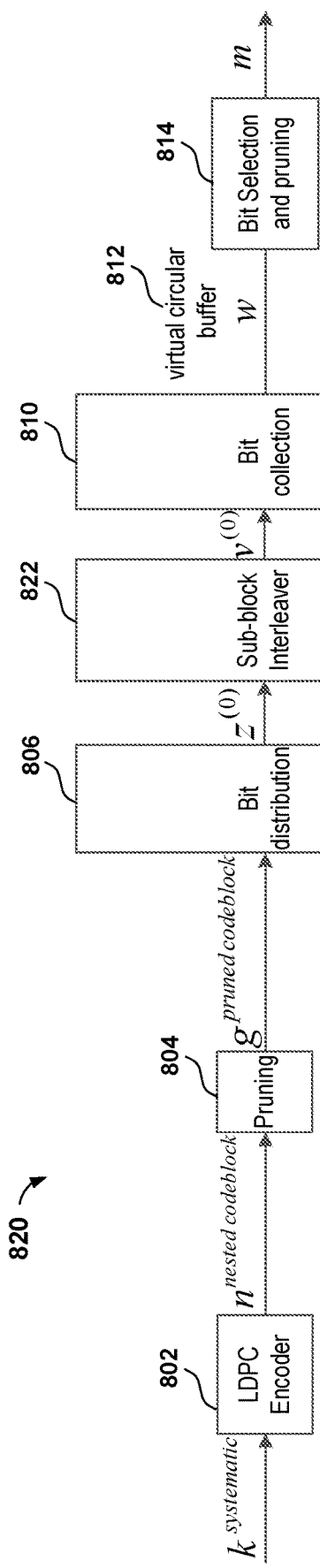
FIG. 8B illustrates a second example of a rate matching and interleaving scheme, in accordance with various aspects of the present disclosure.

Referring to FIG. 8B, in an aspect, a rate matching and interleaver chain 820 (or rate matching plus interleaver schedule) is illustrated. In some aspects, the rate matching and interleaver chain 820 is similar to the rate matching and interleaver chain 800. In some cases, the rate matching and interleaver chain 820 uses a single sub-block interleaver 822, instead of using multiple sub-block interleavers 808. For example, when p (p is the number of sections or groups with Z bits each) equals to one, only $Z^0$ is provided from the bit distribution 806 to the sub-block interleaver 822.

Figure 8C:
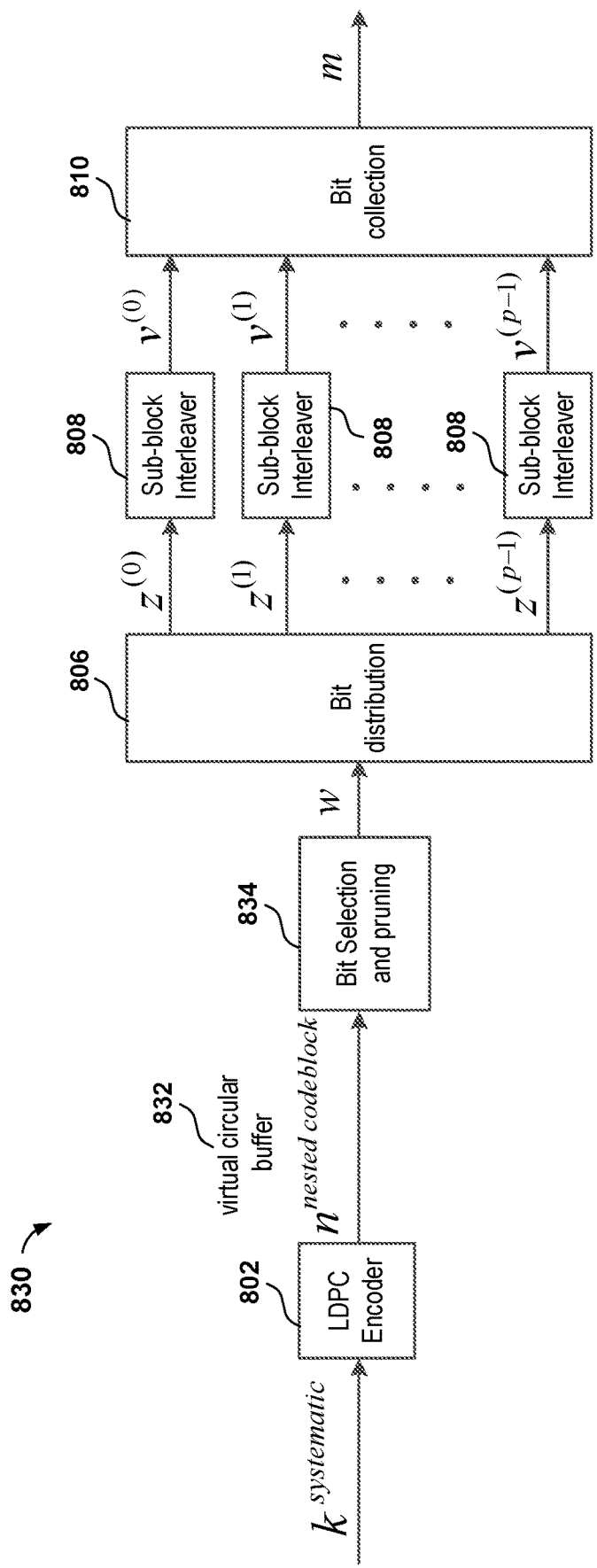
FIG. 8C illustrates a third example of a rate matching and interleaving scheme, in accordance with various aspects of the present disclosure.

Referring to FIG. 8C, in an aspect, a rate matching and interleaver chain 830 (or rate matching plus interleaver chain) is illustrated. In some aspects, the rate matching and interleaver chain 830 may include one or more of the following steps. An LDPC encoder 802 which takes in information bit payload and LDPC encodes leveraging a rate-compatible LDPC code with a structure same or similar to FIG. 7. In an aspect, the nested codeblock produced by the LDPC encoder 802 may be sized to a block length and rate consistent with the scheduled resources and rate allocated for transmission. In an aspect, the output of the LDPC encoder 802 may be fed to a virtual circular buffer 832, and then a bit selection and pruning 834 may be configured to perform repetition and/or pruning. In an aspect, an optional pruning step may potentially follow the LDPC encoder 802 for removal of filler bits, and to perform any necessary residual pruning such as puncturing bits or puncturing from the tail or the head of the LDPC codeblock.

In an aspect, a bit distribution 806 that may segment the pruned codeblock of g bits into one or more sub-blocks, for example, the number of sub-blocks $$p = \lceil \tfrac{w}{z} \rceil$$

sections (or groups) of Z bits each, where the last section is zero padded if w is not an even multiple of Z. In some examples, a respective sub-block interleaver 808 may be used on each of the p sections (having Z bits in each section). In an aspect, a bit collection 810 may be configured to concatenate the Z-bit sections. After modulation, a tone interleaver may be implemented to interleave tones within a symbol.

In some aspects of the chain 830 in FIG. 8C, the rate matching (e.g., bit-selection or pruning) from the circular buffer 832 may be done before the sub-block interleaver 808. The fact that the interleaver operates on Z bits allows for a different interleaving sequence to be applied to the p sections of Z bits across the different repeated copies of the N bit codeblock from the encoder at a low complexity, which may lead to additional diversity gains with low hardware overhead. In an example, the row column dimensioning or column/row permutation pattern may change for each group of Z bits, and the sequence of patterns may change when a new codeblock repeated section is encountered.

Figure 8D:
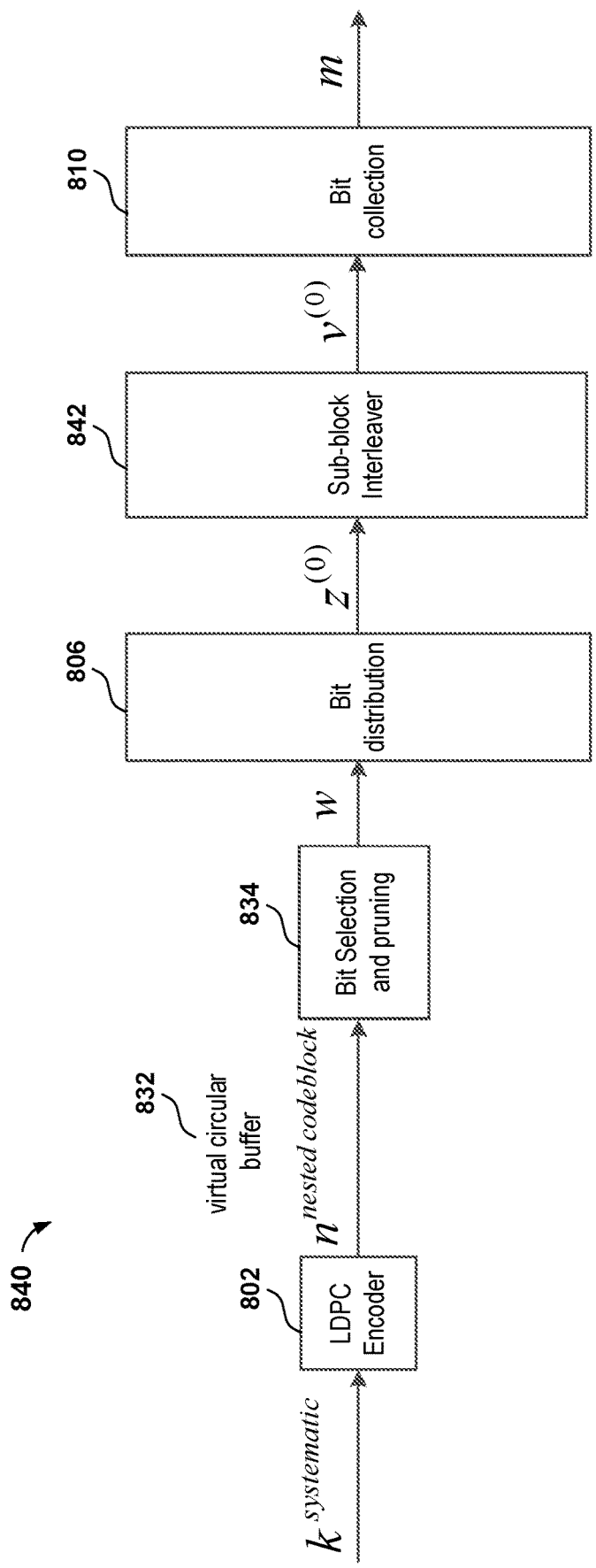
FIG. 8D illustrates a fourth example of a rate matching and interleaving scheme, in accordance with various aspects of the present disclosure.

Referring to FIG. 8D, in an aspect, a rate matching and interleaver chain 840 (or rate matching plus interleaver schedule) is illustrated. In some aspects, the rate matching and interleaver chain 840 is similar to the rate matching and interleaver chain 830. In some cases, the rate matching and interleaver chain 840 uses a single sub-block interleaver 842, instead of using multiple sub-block interleavers 808. For example, when p (p is the number sections of Z bits) equals to one, only $Z^0$ is provided from the bit distribution 806 to the sub-block interleaver 822.

Figure 9:
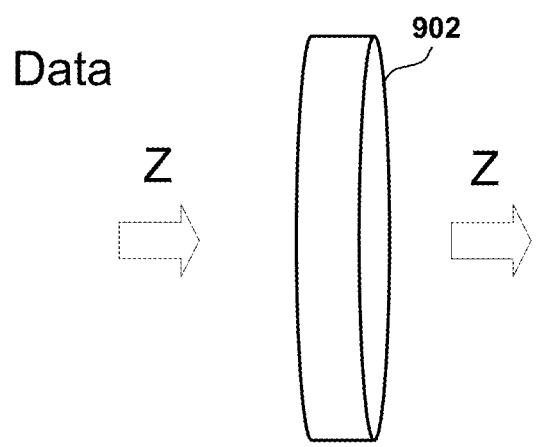
FIG. 9 illustrates an example of a circular shifter, in accordance with various aspects of the present disclosure.

Referring to FIG. 9, in an aspect, a sub-block interleaver 808 on Z bits may be implemented as a row/column interleaver. An example of a row/column interleaver includes that the number of columns is C and the number of rows is R, and Z is the minimum integer such that Z≤(R×C). In some examples, data is written in row order, columns are permuted and data read out in column order. In some cases, Matrix zero padding may be necessary.

Still referring to FIG. 9, in another aspect, each section of Z bits may be applied a circular shift 902, as illustrated in FIG. 9. In some examples, the circular shift pattern, and similarly the number of rows and columns for a row/column interleaver, may be pseudo-random, may be determined as a function of the parameters Z, a modulation order (e.g., quadrature phase shift keying (QPSK), QAM 256 etc.), a column index, a repetition index, or the number of times around the circular buffer for a particular group of Z bits within the rate-matched stream m in FIG. 8D, and/or may be a predetermined rule.

Figure 10:
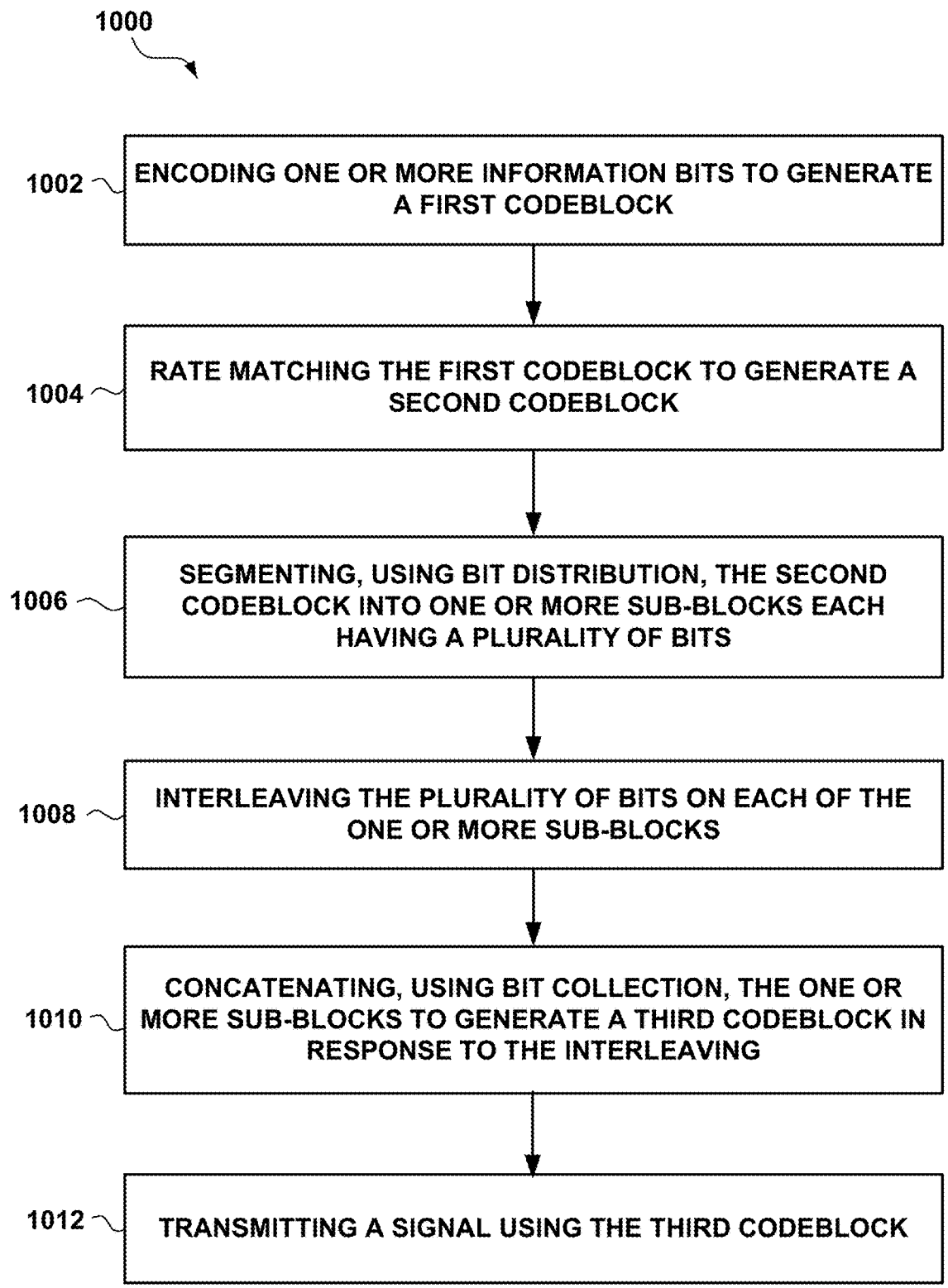
FIG. 10 is a flow chart of an example method of rate matching and interleaving, according to one or more of the presently described aspects.

Referring to FIG. 10, in an operational aspect, a UE such as UE 12 and/or UE 14 (FIG. 1), or a network entity (e.g., an eNB) such as network entity 20 (FIG. 1) may perform one or more aspects of a method 1000 for rate matching and interleaving in a wireless communications system (e.g., a 5G NR system). For example, the coding management component 40, the LDPC encoder/decoder 42, the pruning component 44, the bit distribution component 46, the one or more interleavers 48, the bit collection component 50, and/or the rate matching component 52, e.g., in conjunction with one or more of the processors 103, the memory 130, the modem 108, and/or the transceiver 106, may be configured to may be configured to perform aspects of the method 1000.

In an aspect, at block 1002, the method 1000 may include encoding one or more information bits to generate a first codeblock. In an aspect, for example, the LDPC encoder/decoder 42, e.g., in conjunction with one or more of the processors 103, the memory 130, the modem 108, and/or the transceiver 106, may be configured to encode one or more information bits to generate a first codeblock. For example, the LDPC encoder/decoder 42 may take in information payload (in bits) and generate a rate-compatible LDPC code with a structure same or similar to the structure 700 in FIG. 7. In an aspect, the codeblock produced by the encoder may be nested codeblock, and may be sized to a block length and rate consistent with the scheduled resources and rate allocated for transmission.

In an aspect, at block 1004, the method 1000 may include rate matching the first codeblock to generate a second codeblock. In an aspect, for example, the pruning component 44, and/or rate matching component 52, e.g., in conjunction with one or more of the processors 103, the memory 130, the modem 108, and/or the transceiver 106, may be configured to perform rate matching for the first codeblock to generate a second codeblock. In some example, the UE may be configured to perform or use at least one of a bit repetition or bit pruning for the first codeblock.

In an aspect, at block 1006, the method 1000 may include segmenting, using bit distribution, the second codeblock into one or more sub-blocks each having a plurality of bits. In an aspect, for example, the bit distribution component 46, e.g., in conjunction with one or more of the processors 103, the memory 130, the modem 108, and/or the transceiver 106, may be configured to segment, using bit distribution, the second codeblock into one or more sub-blocks each having a plurality of bits. In some examples, each of the one or more sub-blocks may have a same number of bits.

In an aspect, at block 1008, the method 1000 may include interleaving the plurality of bits on each of the one or more sub-blocks. In an aspect, for example, the one or more interleavers 48 (e.g., one or more sub-block interleavers 808), e.g., in conjunction with one or more of the processors 103, the memory 130, the modem 108, and/or the transceiver 106, may be configured to interleave the plurality of bits on each of the one or more sub-blocks. In some examples, each sub-block (e.g., a section of bits in the second codeblock) may be fed to a sub-block interleaver which applies a row/column interleaver on a bit stream.

In an aspect, at block 1010, the method 1000 may include concatenating, using bit collection, the one or more sub-blocks to generate a third codeblock in response to the interleaving. In an aspect, for example, the bit collection component 50, e.g., in conjunction with one or more of the processors 103, the memory 130, the modem 108, and/or the transceiver 106, may be configured to concatenate or combine (using bit collection) the one or more sub-blocks to generate a third codeblock in response to the interleaving at block 1008.

In an aspect, at block 1012, the method 1000 may include transmitting a signal using the third codeblock. In an aspect, for example, the coding management component 40, e.g., in conjunction with one or more of the processors 103, the memory 130, the modem 108, and/or the transceiver 106, may be configured to transmit the signal using the third codeblock (e.g., in response to the bit collection at block 1010).

In some aspect, 5G NR rate matching and interleaver steps are ordered as in FIG. 8A, FIG. 8B, FIG. 8C, and/or FIG. 8D. In an aspect, for FIG. 8A and FIG. 8B ordering, the system may include encoding (with inherent pruning), optional residual pruning, bit distribution, interleaver on Z bits, bit collection, virtual circular buffer for optional residual pruning, repetition and HARQ chase combining and/or incremental redundancy. In another aspect, for FIG. 8C and FIG. 8D ordering, the system may include encoding (with inherent pruning), virtual circular buffer for optional residual pruning, repetition and HARQ chase combining and/or incremental redundancy, a bit distribution, interleaver on Z bits, and/or a bit collection. In an aspect, an interleaver on Z bits may encompass the entire codeblock for good performance or a subset of the entire codeblock to reduce latency and hardware complexity. In some example, a row column interleaver on Z bits, and/or a circular shift interleaver on Z bits may be used.

In some aspects, an interleaver pattern as a function of Z, a modulation order (e.g. QPSK, QAM 256 etc.), a column index, a repetition index, and/or the number of times around the circular buffer for a particular group of Z bits within the rate-matched stream m (e.g., shown in FIG. 8C and FIG. 8D), may be used in one or more of the 5G NR rate matching and interleaver steps.

In an aspect, an interleaver may be disabled on shortened or punctured columns when shortened or punctured bits are not sent over the air, in order to simplify infinite or zero log-likelihood ratio (LLR) insertion in the receiver.

In an aspect, for example, the rate matching component 52 may be communicatively coupled with the bit collection component 50, and configured to operate subsequent to the operation of the bit collection component 50. In another example, the rate matching component 52 may be communicatively coupled with the LDPC encoder/decoder 42, and configured to operate subsequent to the operation of the LDPC encoder/decoder 42. In some cases, the bit distribution component 46 may be communicatively coupled with the rate matching component 52, and configured to operate subsequent to the operation of the rate matching component 52.

In some aspects, the rate matching component 52, e.g., in conjunction with one or more of the processors 103, the memory 130, the modem 108, and/or the transceiver 106, may be configured to perform at least one of residual pruning, repetition, HARQ chase combining, or incremental redundancy.

Several aspects of a telecommunications system have been presented with reference to an LTE/LTE-A or a 5G NR communications system. As those skilled in the art will readily appreciate, various aspects described throughout this disclosure may be extended to other telecommunication systems, network architectures and communication standards.

By way of example, various aspects may be extended to other communication systems such as High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communications by a user equipment (UE), comprising:
   storing, by a circular buffer, bits of a first codeblock generated by encoding one or more information bits, wherein the circular buffer includes a starting index corresponding to the bits of the first codeblock;
   rate matching the first codeblock to generate a second codeblock, wherein the bits of the first codebook are read from the starting index of the circular buffer;
   segmenting, using bit distribution, the second codeblock into one or more sub-blocks each having a plurality of bits;
   interleaving the plurality of bits on each of the one or more sub-blocks;
   concatenating, using bit collection, the one or more sub-blocks to generate a third codeblock in response to the interleaving; and
   transmitting a signal using the third codeblock.

2. The method of claim 1, wherein the rate matching comprises rate matching using at least one of bit selection or bit pruning for the first codeblock.

3. The method of claim 1, wherein each of the one or more sub-blocks has a same number of bits.

4. The method of claim 1, wherein the segmenting comprises segmenting the second codeblock into one sub-block having a same number of bits of the second codeblock.

5. The method of claim 1, wherein the segmenting comprises segmenting the second codeblock into multiple sub-blocks each having a subset number of bits of the second codeblock.

6. The method of claim 1, wherein the rate matching comprises puncturing or repeating one or more bits in the first codeblock via a virtual circular buffer.

7. The method of claim 1, wherein the interleaving comprises interleaving via a row/column interleaver.

8. The method of claim 1, wherein the interleaving comprises applying a circular shift to each of the one or more sub-blocks.

9. The method of claim 1, wherein the interleaving comprises interleaving based on at least a function of a codeblock size, a modulation order, a column index, or a number of times around a virtual circular buffer for a particular sub-block of the one or more sub-blocks.

10. The method of claim 1, wherein the first codeblock comprises: a rate comparable parity check matrix (PCM) structure; a set of codes; a set of parity bits; or some combination thereof.

11. An apparatus for wireless communications, comprising:
    a transmitter configured to transmit signals;
    a memory configured to store instructions; and
    at least one processor communicatively coupled with the transmitter and the memory, wherein the at least one processor is configured to execute the instructions to:
    store, by a circular buffer, bits of a first codeblock generated by encoding one or more information bits, wherein the circular buffer includes a starting index corresponding to the bits of the first codeblock;
    rate match the first codeblock to generate a second codeblock, wherein the bits of the first codebook are read from the starting index of the circular buffer;
    segment, using bit distribution, the second codeblock into one or more sub-blocks each having a plurality of bits;
    interleave the plurality of bits on each of the one or more sub-blocks;
    concatenate, using bit collection, the one or more sub-blocks to generate a third codeblock in response to the interleaving; and
    transmit, via the transmitter, a signal using the third codeblock.

12. The apparatus of claim 11, wherein the instructions to rate match the first codeblock comprises further instructions to rate match using at least one of bit selection or bit pruning for the first codeblock.

13. The apparatus of claim 11, wherein each of the one or more sub-blocks has a same number of bits.

14. The apparatus of claim 11, wherein the instructions to segment the second codeblock comprises further instructions to segment the second codeblock into one sub-block having a same number of bits of the second codeblock.

15. The apparatus of claim 11, wherein the instructions to segment the second codeblock comprises further instructions to segment the second codeblock into multiple sub-blocks each having a subset number of bits of the second codeblock.

16. The apparatus of claim 11, wherein the instructions to rate match the first codeblock comprises further instructions to puncture or repeat one or more bits in the first codeblock via a virtual circular buffer.

17. The apparatus of claim 11, wherein the instructions to interleave the plurality of bits comprises further instructions to interleave the plurality of bits via a row/column interleaver.

18. The apparatus of claim 11, wherein the instructions to interleave the plurality of bits comprises further instructions to apply a circular shift to each of the one or more sub-blocks.

19. The apparatus of claim 11, wherein the instructions to interleave the plurality of bits comprises further instructions to interleave the plurality of bits based on at least a function of a codeblock size, a modulation order, a column index, or a number of times around a virtual circular buffer for a particular sub-block of the one or more sub-blocks.

20. The apparatus of claim 11, wherein the first codeblock comprises: a rate comparable parity check matrix (PCM) structure; a set of codes; a set of parity bits; or some combination thereof.

21. An apparatus for wireless communications, comprising:
    means for storing bits of a first codeblock in a circular buffer, wherein the circular buffer includes a starting index corresponding to the bits of the first codeblock, the first codeblock being generated by encoding one or more information bits;
    means for rate matching the first codeblock to generate a second codeblock, wherein the bits of the first codebook are read from the starting index of the circular buffer;
    means for segmenting, using bit distribution, the second codeblock into one or more sub-blocks each having a plurality of bits;
    means for interleaving the plurality of bits on each of the one or more sub-blocks;
    means for concatenating, using bit collection, the one or more sub-blocks to generate a third codeblock in response to the interleaving; and
    means for transmitting a signal using the third codeblock.

22. The apparatus of claim 21, wherein the means for rate matching comprises means for rate matching using at least one of bit selection or bit pruning for the first codeblock.

23. The apparatus of claim 21, wherein the means for segmenting comprises means for segmenting the second codeblock into one sub-block having a same number of bits of the second codeblock.

24. The apparatus of claim 21, wherein the means for segmenting comprises means for segmenting the second codeblock into multiple sub-blocks each having a subset number of bits of the second codeblock.

25. The apparatus of claim 21, wherein the means for rate matching comprises means for puncturing or repeating one or more bits in the first codeblock via a virtual circular buffer.

26. The apparatus of claim 21, wherein the means for interleaving comprises means for interleaving based on at least a function of a codeblock size, a modulation order, a column index, or a number of times around a virtual circular buffer for a particular sub-block of the one or more sub-blocks.

27. The apparatus of claim 21, wherein the first codeblock comprises: a rate comparable parity check matrix (PCM) structure; a set of codes; a set of parity bits; or some combination thereof.

28. A non-transitory computer-readable medium storing computer code executable by at least one processor for wireless communications, comprising:
    code for storing, by a circular buffer, bits of a first codeblock generated by encoding one or more information bits, wherein the circular buffer includes a starting index corresponding to the bits of the first codeblock;
    code for rate matching the first codeblock to generate a second codeblock, wherein the bits of the first codebook are read from the starting index of the circular buffer;
    code for segmenting, using bit distribution, the second codeblock into one or more sub-blocks each having a plurality of bits;
    code for interleaving the plurality of bits on each of the one or more sub-blocks;
    code for concatenating, using bit collection, the one or more sub-blocks to generate a third codeblock in response to the interleaving; and
    code for transmitting a signal using the third codeblock.

29. The non-transitory computer-readable medium of claim 28, wherein the code for rate matching comprises code for rate matching using at least one of bit selection or bit pruning for the first codeblock.

30. The non-transitory computer-readable medium of claim 28, wherein the code for segmenting comprises code for segmenting the second codeblock into one sub-block having a same number of bits of the second codeblock.

31. The non-transitory computer-readable medium of claim 28, wherein the code for segmenting comprises code for segmenting the second codeblock into multiple sub-blocks each having a subset number of bits of the second codeblock.

32. The non-transitory computer-readable medium of claim 28, wherein the code for rate matching comprises code for puncturing or repeating one or more bits in the first codeblock via a virtual circular buffer.

33. The non-transitory computer-readable medium of claim 28, wherein the code for interleaving comprises code for interleaving based on at least a function of a codeblock size, a modulation order, a column index, or a number of times around a virtual circular buffer for a particular sub-block of the one or more sub-blocks.

34. The non-transitory computer-readable medium of claim 28, wherein the first codeblock comprises: a rate comparable parity check matrix (PCM) structure; a set of codes; a set of parity bits; or some combination thereof.

* * * * *